United States Patent [19]
Henkels et al.

[11] Patent Number: 5,481,495
[45] Date of Patent: Jan. 2, 1996

[54] CELLS AND READ-CIRCUITS FOR HIGH-PERFORMANCE REGISTER FILES

[75] Inventors: Walter H. Henkels, Putnam County; Wei Hwang; Terry I. Chappell, both of Westchester County, all of N.Y.

[73] Assignee: International Business Machines Corporation, Armonk, N.Y.

[21] Appl. No.: 226,161

[22] Filed: Apr. 11, 1994

[51] Int. Cl.$^6$ .................................................. G11C 7/00
[52] U.S. Cl. ............................... 365/189.02; 365/230.03; 365/230.05
[58] Field of Search ................... 365/189.02, 230.02, 365/230.03, 230.05

[56] References Cited

U.S. PATENT DOCUMENTS 5,315,178  5/1994  Snider ........................... 365/189.02 X

*Primary Examiner*—Do Hyun Yoo
*Attorney, Agent, or Firm*—Whitham, Curtis, Whitham & McGinn

[57] ABSTRACT

A high-performance register file is implemented in a multi-block structure consisting of sub-arrays and associated multiplexing circuits. For a given port, the outputs of all multiplexer circuits are dotted together to form a single global output. The multiplexer circuits may be completely external to the cells ("standard" approach), or distributed and integrated into the cells ("alternate" approach). The register cells arranged as such, may or may not contain extra latches, pass gates, and controls arranged so that the file may be fully tested via LSSD.

8 Claims, 15 Drawing Sheets

"STANDARD" – MUX
(1 PORT)

ALTERNATE – MUX ··· 3 PORTS
(EXTERNAL TO CELLS)

CELLS AND READ-CIRCUITS FOR HIGH-PERFORMANCE REGISTER FILES

BACKGROUND OF THE INVENTION

1. Field of the Invention

The present invention generally relates to the design and fabrication of register file cells implemented in integrated circuits (ICs) and, more particularly, to small multi-port register file cells that are very fast and suitable for very large scale integration (VLSI).

2. Description of the Prior Art

High performance in register files is hindered by the bit line loading presented by multiple ports. High performance via known conventional means implies large cell sizes, or complex and tightly controlled sense amplifier timing. Register files contained in VLSI circuit chips are inaccessible for stand-alone testing, and are not conventionally testable as logic via level-sensitive scan design (LSSD) circuitry. Typically, some additional circuitry is required. Such circuitry implies an overhead to the area, the performance, and the design of the register file.

In order to achieve small cells for multi-port register files it is advantageous to implement both single-ended reading and writing. A conventional register file cell is shown in FIG. 1, for a case of two write ports and four read ports. The storage element of the cell is composed of a cross-coupled-inverter pair 11 and 12 connected between the write pass gates 13 and 14 and a third inverter 15. The output of the third inverter 15 is connected to the four read pass gates 16, 17, 18, and 19, each of which is coupled to a respective bit line. The multiple bit lines and their associated pass gates 16 to 19 present significant loading to the cross-coupled-inverter storage element 11 and 12, hence typically a third, larger, inverter 15 and large read pass gates are required to drive the read bit lines.

Typically, in microprocessors, the single-ended bit lines drive static inverters, and the read word lines are static. In such case, when a read address changes a new read pass gate conducts and, in the case of opposite data, requires the bit line and output inverter to switch to the opposite state. As processor performance increases, it becomes increasingly difficult to design dense cells for rapidly driving the multi-port loading.

Another approach to the high-performance problem is to employ dual-rail bit lines, i.e., a bit line and its complement, and employ differential sense amplifiers, such as used in static random access memories (SRAMs) and dynamic random access memories (DRAMs). Disadvantages of this approach are the doubling of the number of bit lines, and the added complications of precharging bit lines and timing the precharge and setting of the sense amplifiers.

U.S. Pat. No. 4,852,061 to Baron et al. discloses a high density, high performance register file that uses a single, unique bit line for each cell in a column and wherein all read bit lines control devices in a multiplexer. However, Baron et al. make no mention of multi-port read and write applications. Furthermore, the Baron et al. register file is organized into a single array, and writing is done via complementary write bit lines; i.e., there are two separate write bit lines for a single write port. Implementing a large multi-port register file by simply expanding upon the teaching of Baron et al. would result in many more read bit lines and write bit lines than desirable. For example, a 3-write port, 3-read port, 32 register file would require 32 read bit lines and six write bit lines per dataflow bit following the Baron et al. approach. This number of lines is a significant disadvantage to the Baron et al. design. In general, the fewer number of lines, the more dense the array, and hence the more suitable the file to a VLSI environment. In addition, the test circuitry implemented by Baron et al. does not allow a full knowledge of the contents of every cell after multi-port read and writes in any single test cycle.

SUMMARY OF THE INVENTION

It is therefore an object of the present invention to provide small, high-performance multi-port register file cells wherein the number of dataflow lines are minimized, making the register file more suitable to a VLSI environment.

It is another object of the invention to provide very fast and small multi-port register file cells which incorporate testing circuitry embedded within the chips which allows full knowledge of the contents of every cell after multi-port read and writes.

According to the invention, the problems encountered in conventional approaches are addressed by implementing the register file as an assembly of blocks consisting of sub-arrays and associated multiplexer circuits. For each read port, the outputs of the blocks are dot-ORed together to form a single output. This implementation is simple and fast. The read access does not require the switching of bit lines; instead, a read access is simply a decode plus a multiplexing operation. The design trade-off for this simplicity is increased layout area, which may be acceptable. In an exemplary design, the required increase in area over a (slower) dual-rail approach is only 25%.

A second part of this invention consists of adding a second cross-coupled inverter pair to each cell and interconnecting all cells via pass gates to form a shift-register-latch suitable for testing via level-sensitive scan design (LSSD). Such implementation enables the register file to be tested as logic, eliminating circuit overhead for array-built-in-self-test.

BRIEF DESCRIPTION OF THE DRAWINGS

The foregoing and other objects, aspects and advantages will be better understood from the following detailed description of a preferred embodiment of the invention with reference to the drawings, in which:

FIG. 4 is a schematic diagram showing in more detail one block of the "standard" approach shown in FIG. 3a;

DETAILED DESCRIPTION OF A PREFERRED EMBODIMENT OF THE INVENTION

Figure 1:
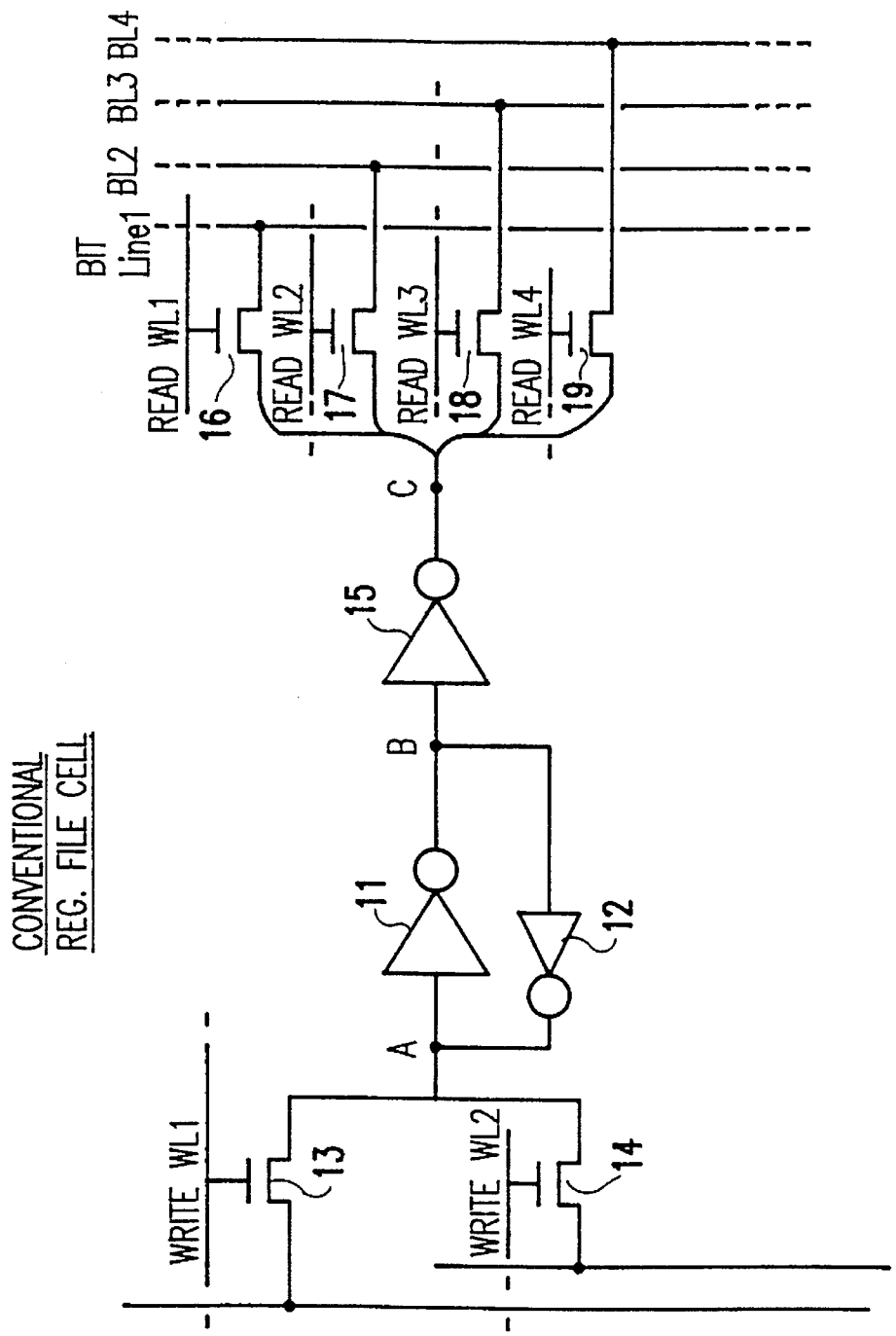
FIG. 1 is a schematic diagram of a conventional register file cell.
Figure 2:
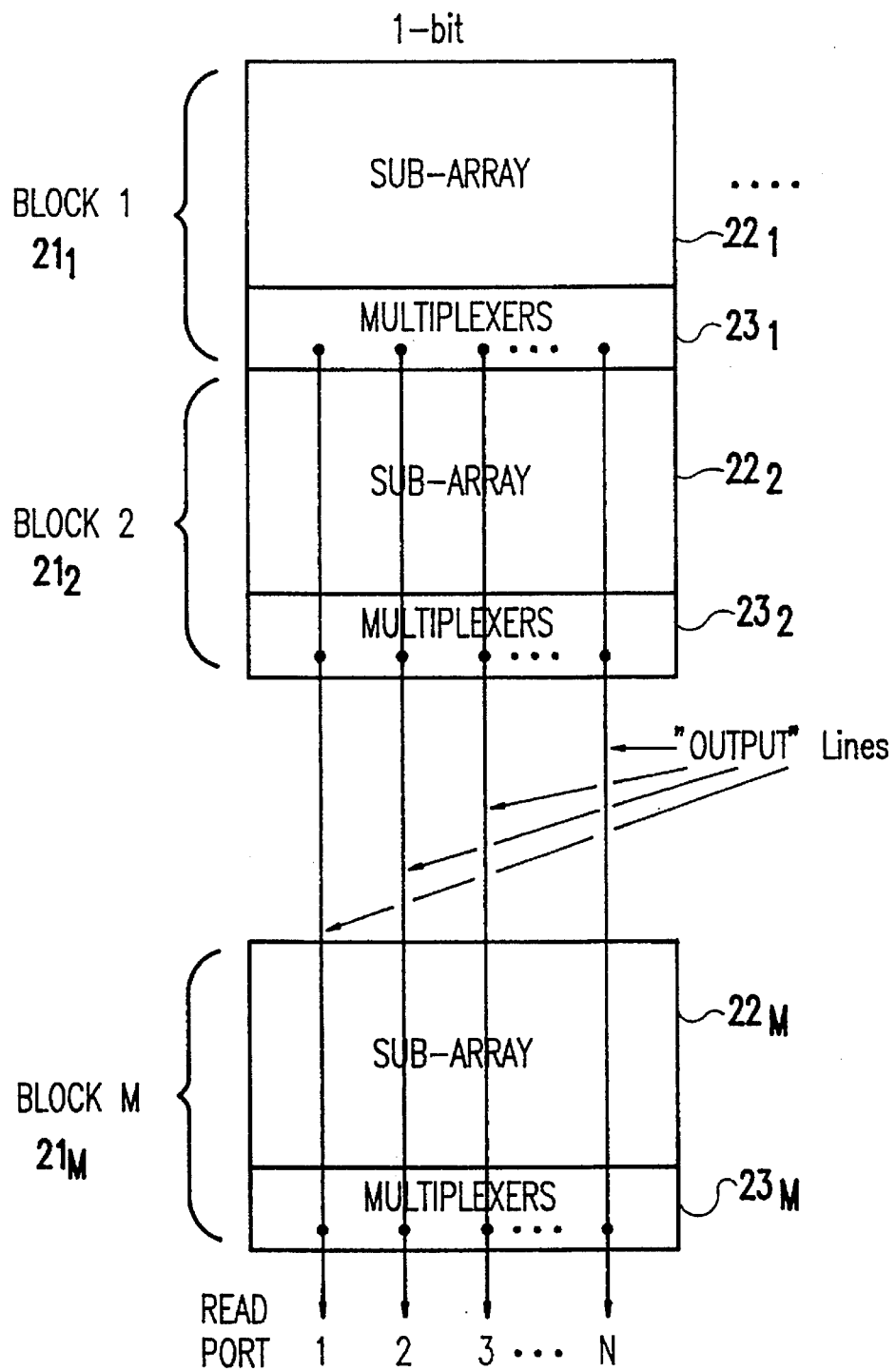
FIG. 2 is a block diagram illustrating the basic concept of the invention for a 1-bit column of an N-read-port register file implemented as M-blocks.

Referring again to the drawings, FIG. 2 shows the concept of the invention for a 1-bit column of an N-read-port register file implemented as M-blocks $21_1, \ldots, 21_M$. Each block consists of a sub-array $22_1, \ldots, 22_M$ of cells and associated multiplexers $23_1, \ldots, 23_M$. The multiplexer outputs for a given port are all dotted together onto a single global output line. Throughout this description, the terminology "dotted" and "dot-ORed" are synonymous with a wired-OR circuit.

Figure 3A:
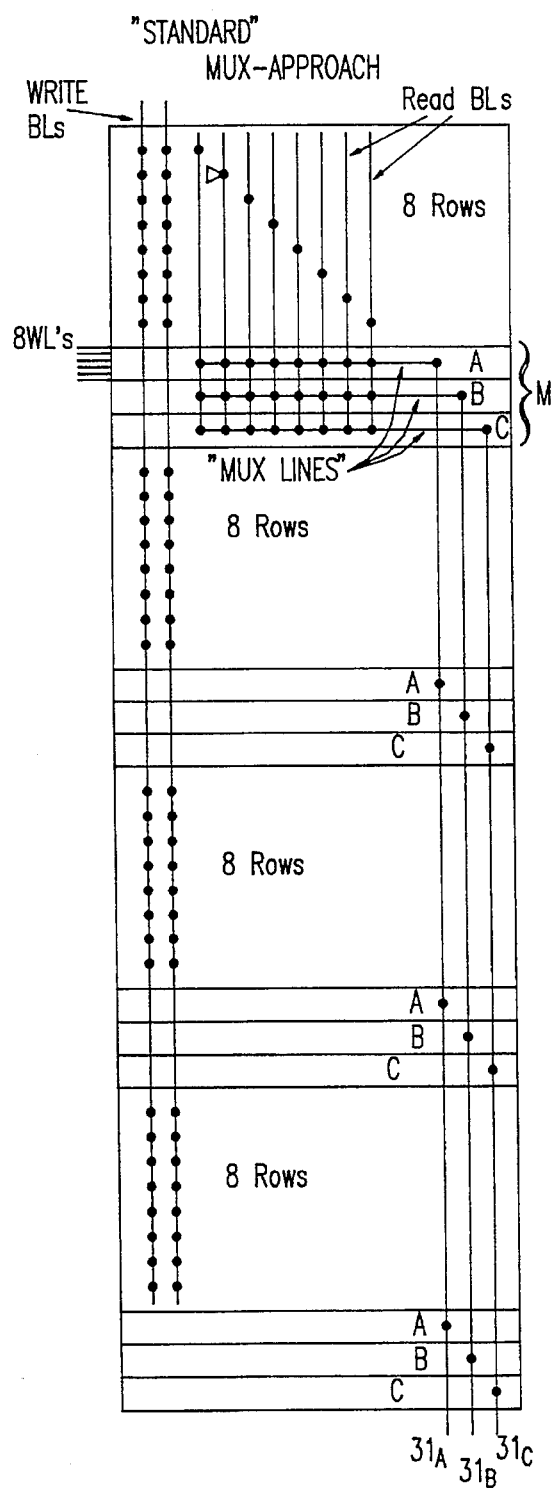
FIGS. 3a and 3b are block diagrams respectively illustrating "standard" and "alternate" multiplexer approaches to the practice of the invention.
Figure 3B:
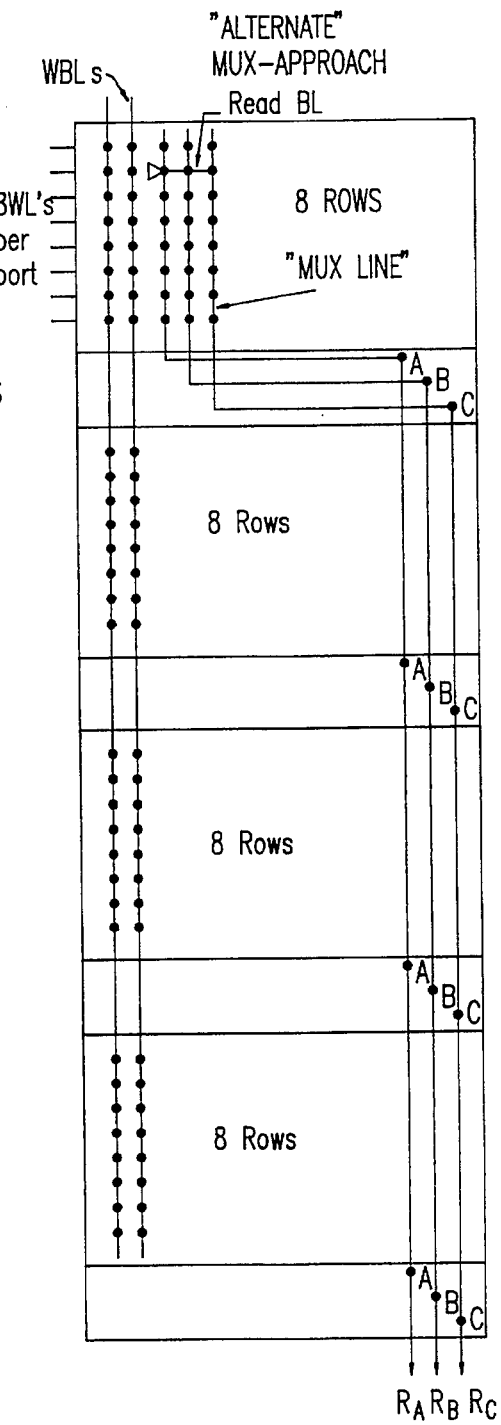

As examples of this invention, in FIGS. 3A and 3B there are shown a 1-bit column of a 2-write port, 3-read port, 32×64 bit register file implemented in four blocks (eight rows per block). Two different implementations are shown: FIG. 3A shows what we call the "standard" multiplexer-approach, and FIG. 3B shows an "alternate" multiplexer-approach. In both approaches, the write bit lines extend the full height of the file and connect to pass gates in every row (indicated by the solid circles).

In the "standard" approach, shown in FIG. 3A, each cell has a single unique bit line which controls devices in three separate multiplexers, here denoted as MUXES A, B and C, one for each read port $31_A$, $31_B$ and $31_C$. For a given read-port, only one "multiplexer-line" (of the four available) will be activated, and this will activate the associated output line onto which the multiplexer-lines are dotted.

In the "alternate" approach, shown in FIG. 3B, the multiplexer devices and major portions of the multiplexer-lines are shifted back into the array, so that now only the multiplexer-lines run vertically through a block. The bit line lengths are reduced to a minimum. The "alternate" approach reduces the number of vertical read-lines down from the eight vertical read bit lines of the standard approach, to the three vertical multiplexer lines.

Figure 4:
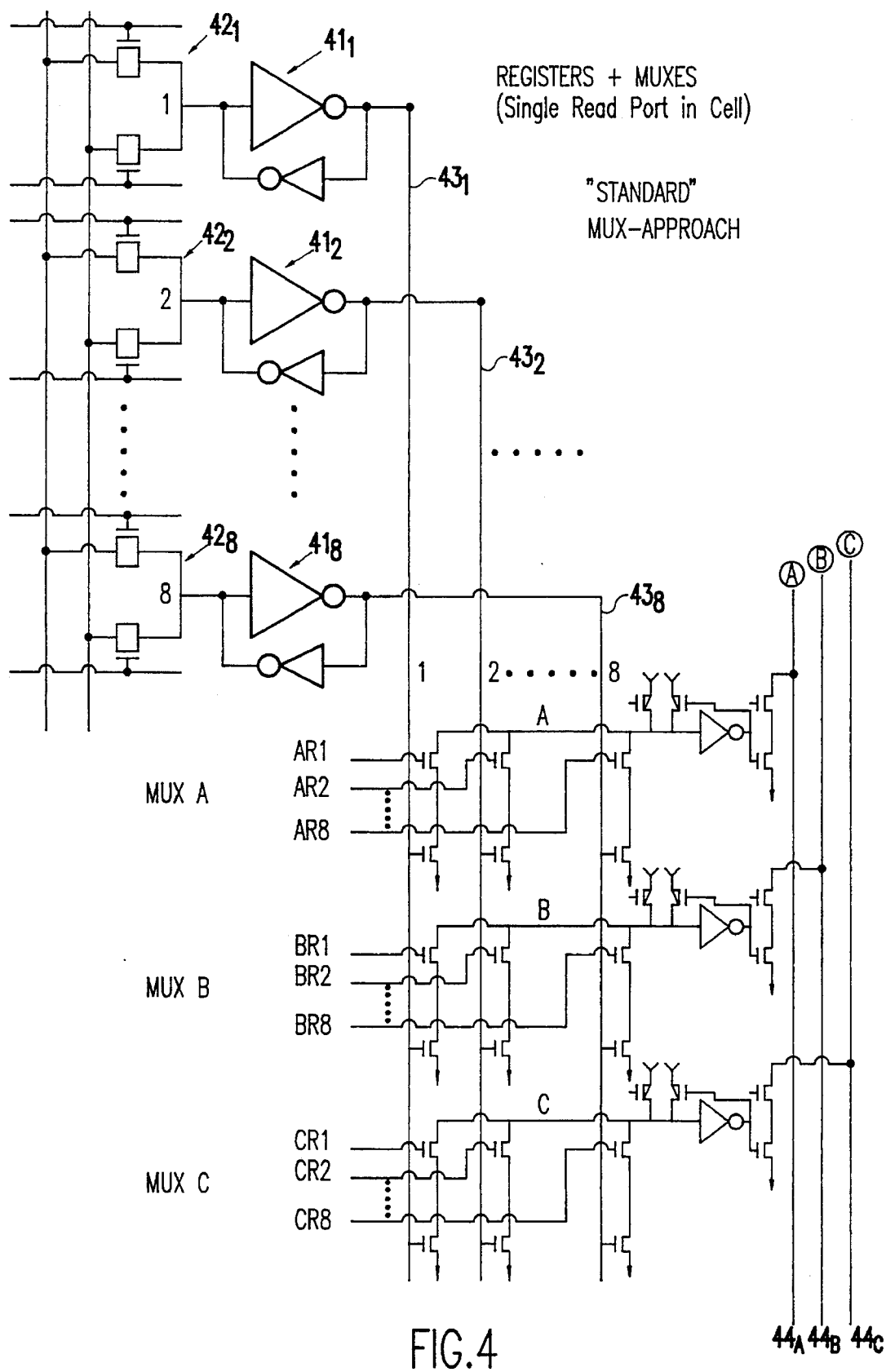

Further detail of one block in the standard approach is shown in FIG. 4, wherein the cross-coupled-inverter pairs $41_1$ to $41_8$ are connected to respective pairs of write pass gates $42_1$ to $42_8$. The eight read bit lines $43_1$ to $43_8$ which run vertically through the block are each connected to a single cross-coupled-inverter pair. These read bit lines serve as controls for devices in each of the multiplexers (MUXes A, B and C). There is one multiplexer for each read port; in this example, there are three read ports, A, B and C. The multiplexer outputs control devices which are connected to corresponding global output lines $44_A$, $44_B$ and $44_C$, one for each read port. Activation of a multiplexer line results in activation of a corresponding output line.

Figure 5:
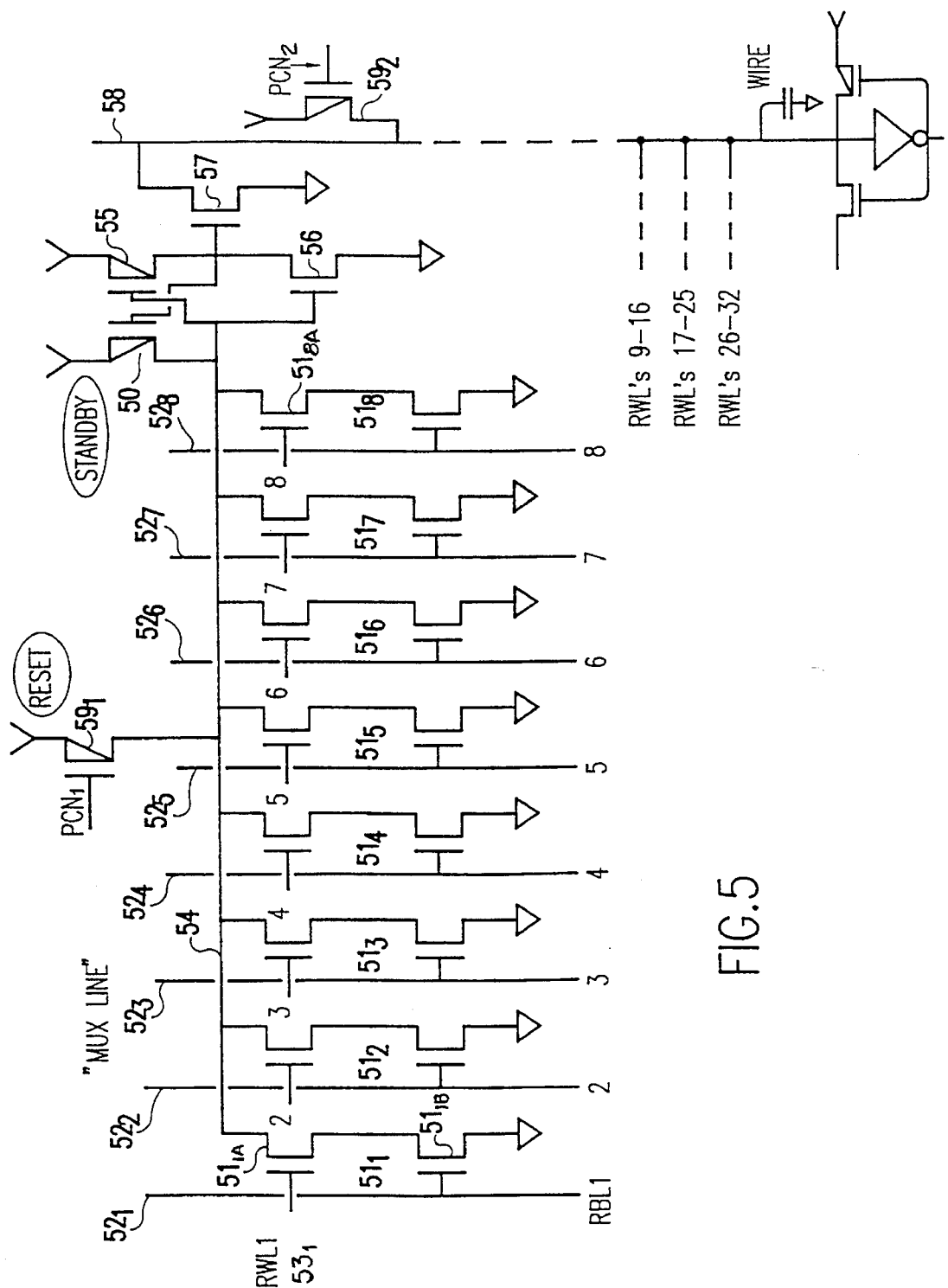
FIG. 5 is a schematic diagram showing in more detail the standard multiplexer circuit for one read-port.

Further detail of the standard multiplexer circuit for one read-port is shown in FIG. 5. Each multiplexer switch block comprises eight pairs of series connected negative-channel metal oxide semiconductor (NMOS) field effect transistors (FETs) $51_1$ to $51_8$. Taking FET pair $51_1$ as exemplary, the gate of the lower FET $51_{1B}$ is connected to read bit line $52_1$, while the gate of the topmost FET $51_{1A}$ is connected to the first multiplexer select line $53_1$. The multiplexer select lines may be thought of as read word lines, since they serve to select the contents of the cells in an entire row of the register file for reading. The drain of FET $51_{1B}$ is connected to the source of FET $51_{1A}$, and the source of FET $51_{1B}$ is connected to circuit ground. The drain of FET $51_{1A}$ is connected to the drains of all the FETs $51_{1A}$ to $51_{8A}$ to form the multiplexer line 54 which is connected in common to the gates of the complementary metal oxide semiconductor (CMOS) inverter pair FETs 55 (PMOS) and 56 (NMOS). The common drain connection of the FETs 55 and 56 is connected to the gate of NMOS FET 57 which, when active, serves to pull down the output line 58. A pair of PMOS FETs $59_1$ and $59_2$, respectively connected to the multiplexer line 54 and the output line 58, reset these lines when their respective control signals $PCN_1$ and $PCN_2$ are active. The PMOS FET 50, also controlled by the output of the inverter pair 55, 56, serves to hold the standby state of the multiplexer line 54. The multiplexer lines are precharged high (the standby state), and each read bit line is ANDed with its associated read word line in this embodiment. The outputs of the corresponding multiplexers in the other blocks are dotted to the global output line 58, as indicated both in FIG. 5 and FIG. 3A.

Figure 6:
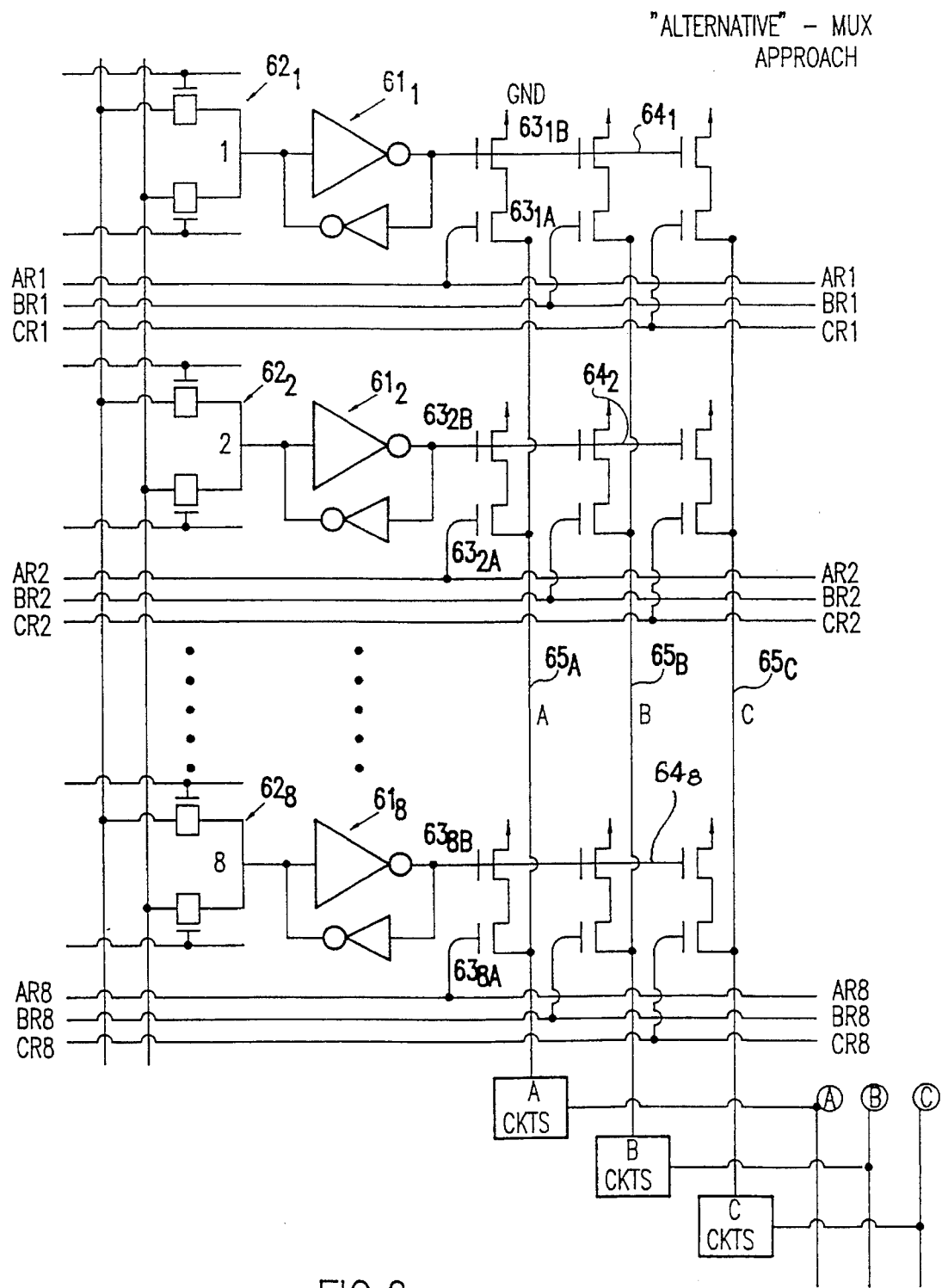
FIG. 6 is a schematic diagram showing in more detail one block of the "alternate" approach shown in FIG. 3b.
Figure 7:
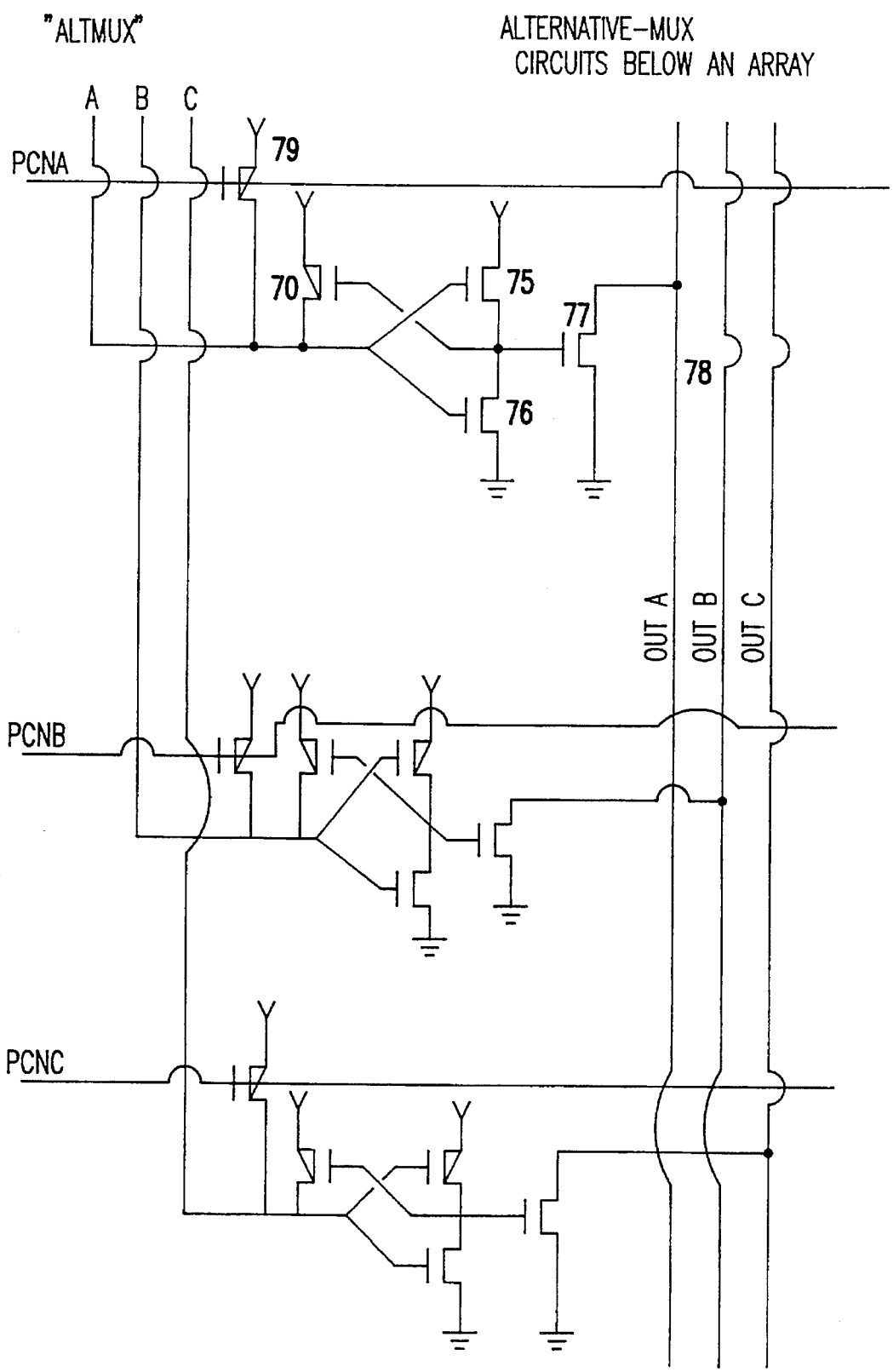
FIG. 7 is a schematic diagram showing in more detail the alternate multiplexer circuit for one read-port.

Corresponding further details of the alternate approach are shown in FIGS. 6 and 7. Referring first to FIG. 6, there is shown cross-coupled inverter pairs $61_1$ to $61_8$ connected to respective pairs of write pass gates $62_1$ to $62_8$. In this approach, the pairs of multiplexer series-connected ANDing devices are moved up into the cells. For example, the devices labelled $51_{1A}$ and $51_{1B}$ of FIG. 5 become the devices labelled $63_{1A}$ and $63_{1B}$ in FIG. 6. Likewise, the other seven pairs of devices $63_{2A}$, $63_{2B}$ to $63_{8A}$ to $63_{8B}$ are contained in cells 2 through 8. In short, the multiplexer is distributed throughout the entire column of eight cells. In FIG. 6, only the devices for the A port are labelled, but similar devices are shown for the other two ports (B and C). The read bit lines $64_1$ to $64_8$ are entirely contained within their respective cells, and hence are much shorter in this alternate approach than they are in the standard approach. Instead of the bit lines being long vertical lines, the multiplexer lines $65_A$, $65_B$ and $65_C$ are the long vertical lines, one for each read port. There are fewer total vertical lines in the alternate approach.

Though most of the multiplexer block devices are contained within the cell array in the alternate approach, there are some devices which remain external to the cell array. These devices are shown in FIG. 7, for all three ports. (FIG. 5 corresponds to the totally external multiplexer in the standard approach for only one port.) In FIG. 7, one may identify the devices 75, 76, 77, 70, and 79 with the corresponding devices 55, 56, 57, 50, and 59 in the standard approach, shown in FIG. 5. The operation of the devices in the alternate approach, shown in FIGS. 6 and 7, is exactly analogous to the operation of the corresponding devices in the standard approach, shown in FIGS. 4 and 5. The specific circuit implementations for the multiplexers shown in FIGS. 5 and 7 are dynamic. These dynamic circuits are compatible with the self-resetting CMOS circuit concepts discussed by T. I. Chappell et al. in *IEEE J. Solid-State Circuits*, vol. 26, no. 11, pp. 1577–1585, November 1991.

A second part of this invention consists of adding a second cross-coupled inverter pair to each cell and interconnecting all cells via pass gates to form a shift-register-latch suitable for testing via LSSD. Such implementation enables the register file to be tested as logic, eliminating circuit overhead for array-built-in-self-test.

Figure 8:
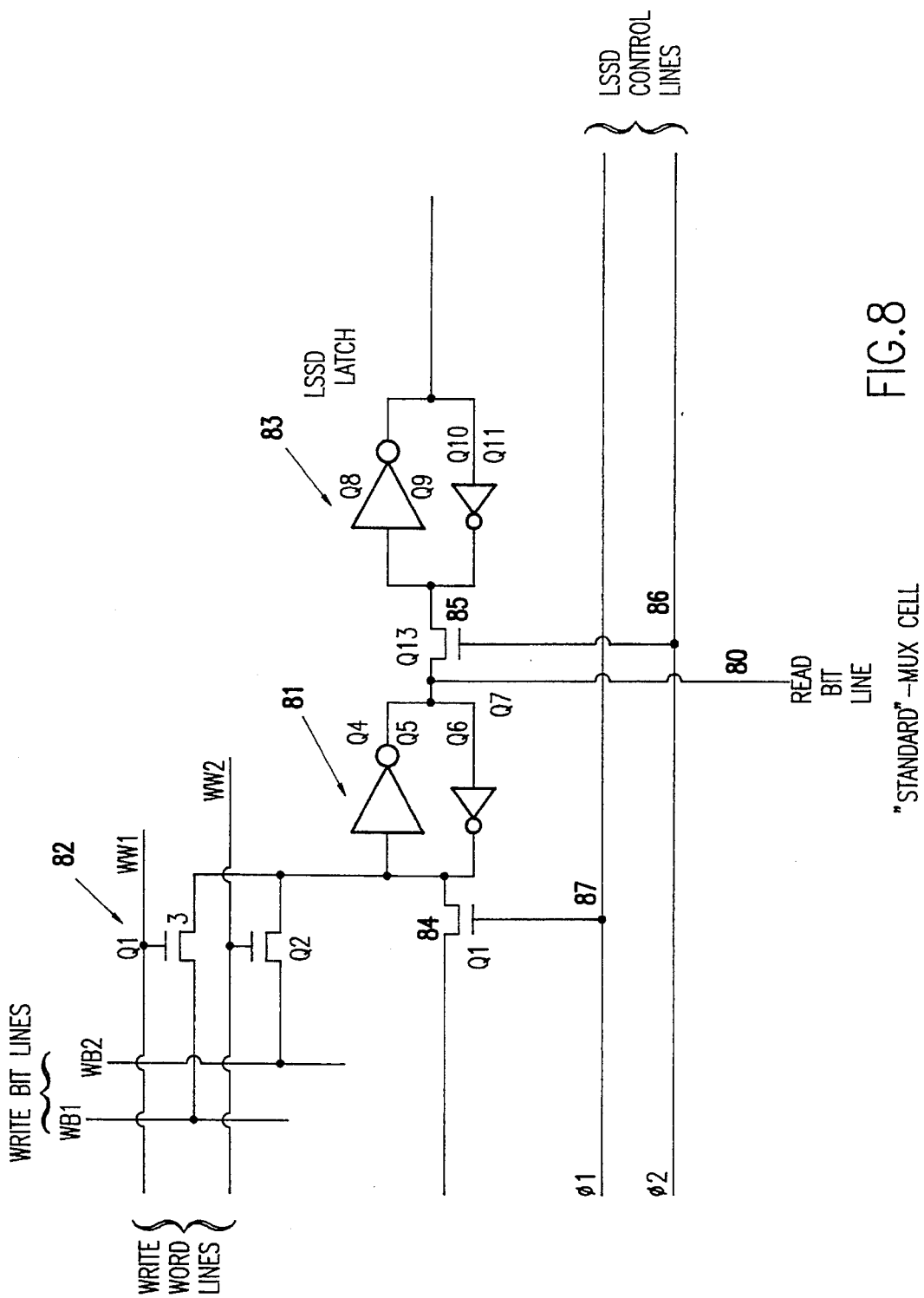
FIG. 8 is a schematic diagram showing the equivalent circuit of a cell in the "standard" multiplexer approach.

FIG. 8 shows the equivalent circuit of a cell in the standard approach. In FIG. 8, cross-coupled-inverter pair 81 is the main storage element, 82 is the pair of write pass gates, and 80 is the read bit line that have already been described in the context of FIG. 4. A shift register configuration is formed by addition of a second cross-coupled-inverter pair 83, the LSSD latch, connected to the cross-coupled-inverter pair 81 by the pass gate 85. The pass gate 84 likewise connects 81 to an adjacent cell to its left. Shifting of data into or out of the register is accomplished by alternately activating the control lines 86 and 87, which are inactive during normal (non-test-mode) cycles. Activation of 86 while 87 is inactive causes pass gate 85 to conduct, thereby causing 81 to write the LSSD latch 83. Data from the adjacent cell on the left is shifted into 81 by activation of control line 87 while 86 is inactive. Alternate activation of 86 and 87 results in a non-destructive shift of data from left-to-right through the register. Since every cell has an included LSSD latch, the contents of every cell in the register can be monitored after read and/or write test cycles.

Figure 9:
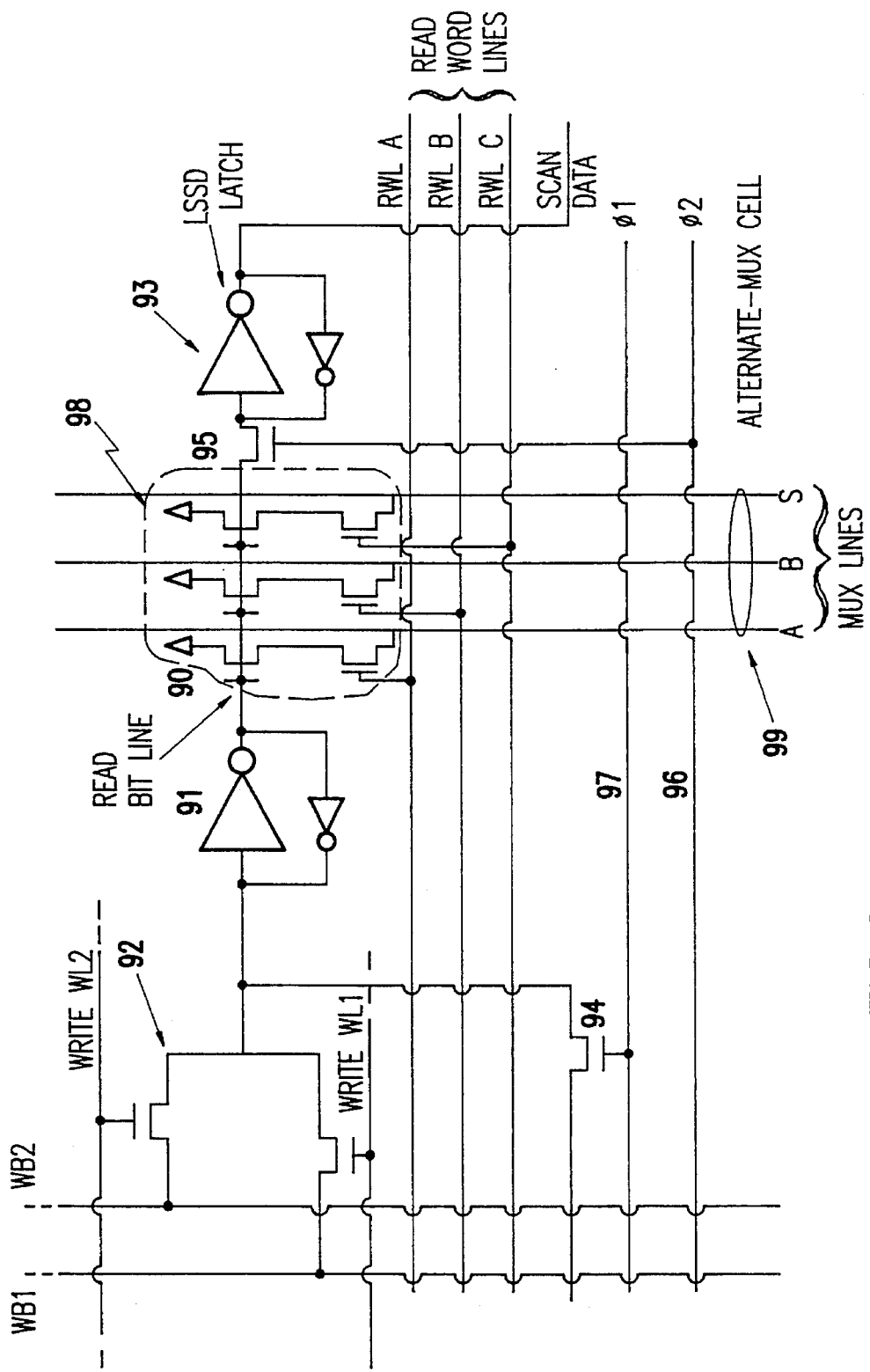
FIG. 9 is a schematic diagram showing the equivalent circuit of a cell in the "alternate" multiplexer approach.

FIG. 9 shows the equivalent circuit of a cell in the alternate approach. Components 90, 91, 92, 93, 94, 95, 96, and 97 are analogous in structure and function to the corresponding components 80, 81, 82, 83, 84, 85, 86, and 87 of the standard cell in FIG. 8. Where the alternate approach cell differs is with the inclusion of the multiplexer devices 98 and the corresponding multiplexer lines 99 (three read ports shown).

In these specific examples, both cells employ the extra LSSD latches, and both cells employ negative-channel metal oxide semiconductor (NMOS) pass gates. In general, with added controls or devices, the NMOS pass gates could be replaced by full complementary metal oxide semiconductor (CMOS) transmission gates; also, in general, the extra LSSD latches may or may not be employed, depending upon the specific test strategy.

The "standard" and "alternate" multiplexer-approaches have some important advantages in common. In the conventional approach the read access consists of decoding, switching the read bit lines, sense-amplification (if employed), and output driving. In the register plus multiplexer approaches according to the invention, the read access consists only of decoding and driving of the output line; i.e., there is no switching of long read bit lines during reading. There are no bit line precharging, no complement bit lines, and no sense amplifier and its associated timing. Furthermore, in the multiplexer-approaches of the invention, there is only one read bit line, independent of the number of read ports. These facts enable a faster access in the multiplexer-approaches of the invention. In the multiplexer-approach, bit lines are switched only during a write operation, and the write and read operations are independent, thereby enabling separate optimization. Finally, inclusion of the extra LSSD latches eases manufacturing testing.

The standard approach of FIG. 3A enables a smaller cell size than the alternate approach of FIG. 3B, because the multiplexer for each port is entirely outside of the cells, whereas in the alternate approach the multiplexer is distributed and partially integrated into the cells. A consequence of this is that the read access in the standard approach is slightly faster due to the fact that the multiplexer lines have more capacitance in the alternate approach. However, the bit lines have less capacitance in the alternate approach, and so writing is faster in that case. Also, the smaller bit line capacitance more readily allows use of NMOS pass gates in the write circuits of alternate-multiplexer cells. The biggest advantage of the "alternate" multiplexer-approach of FIG. 3B is the savings in wires.

A specific implementation was designed as a 2-write port, 3-read port 32×64 bit register file in a CMOS technology employing a 0.5 μm minimum feature size, and a corresponding minimum device effective length of 0.25 μm.

Figure 10:
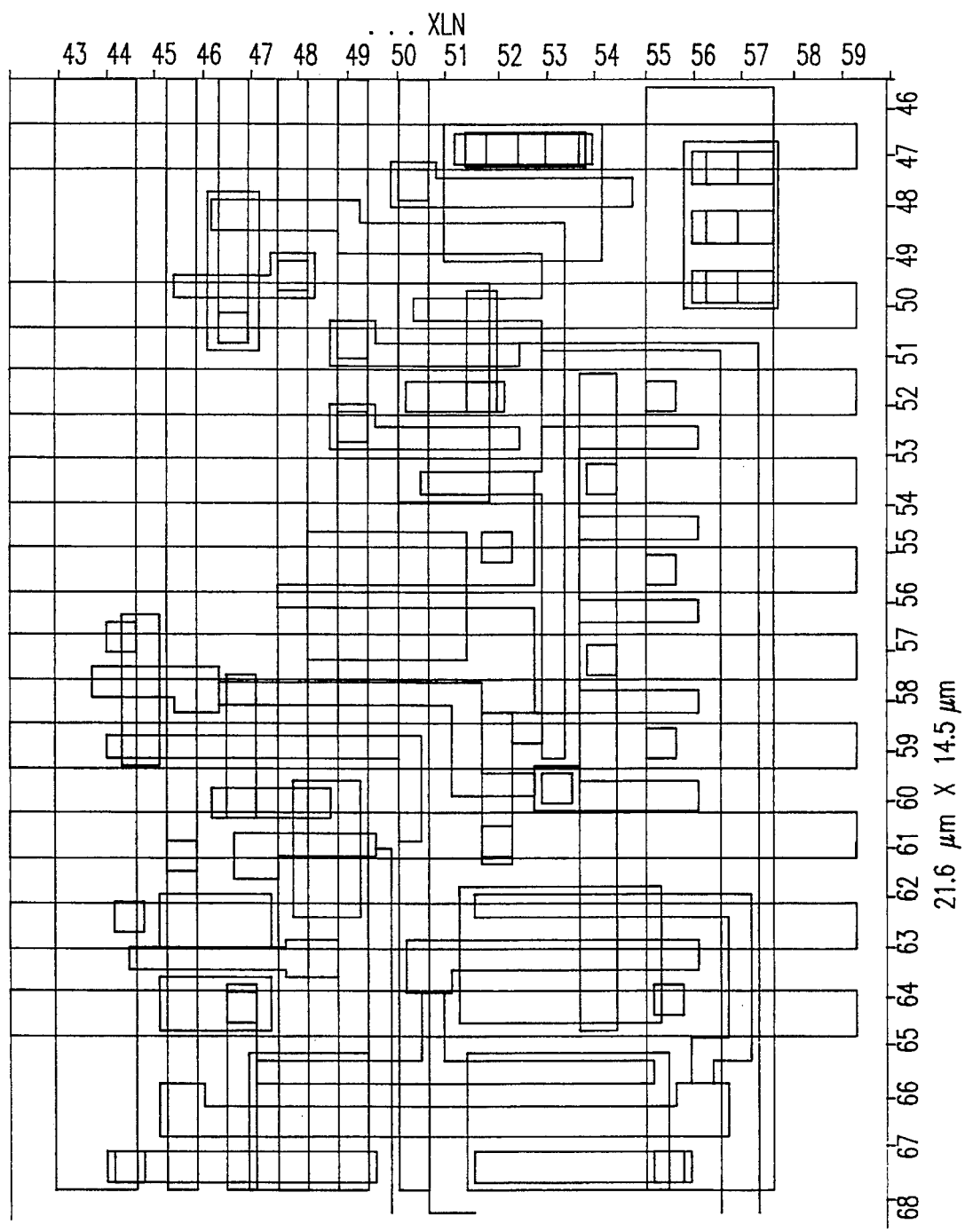
FIGS. 10 and 11 are layouts and sizes for the cells shown in FIGS. 8 and 9, respectively, for specific implementations of the invention in a 0.5 μm minimum feature size technology.
Figure 11:
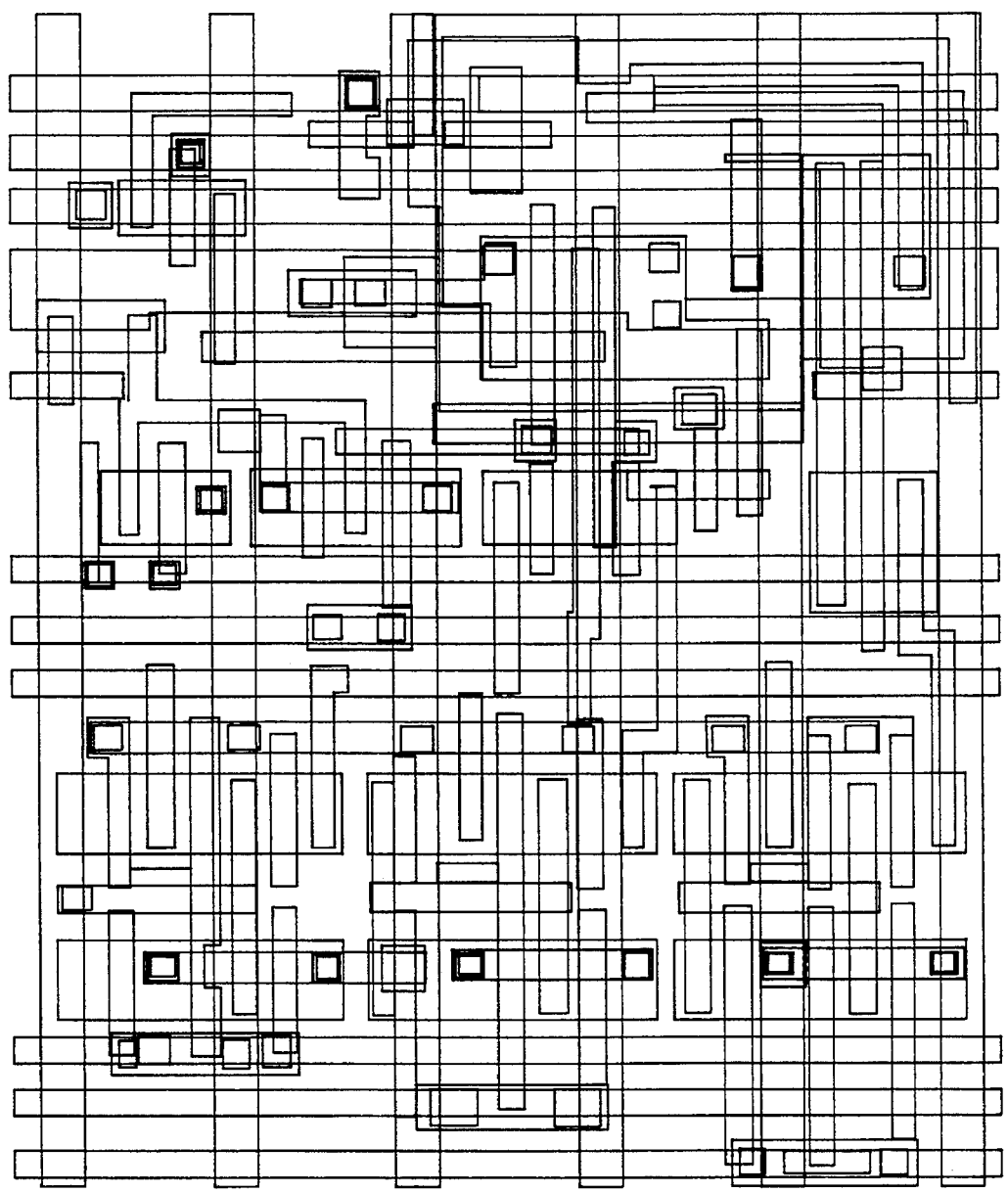

FIGS. 10 and 11 show layouts and sizes for the cells of FIGS. 8 and 9, respectively. The "standard" approach cell, shown in FIG. 10, lays out in an area of 21.6 μm×14.5 μm, whereas the "alternate" approach, shown in FIG. 11, requires more area, 21.6 μm×25.7 μm, in order to accommodate the multiplexer devices and read word lines for three read ports.

Figure 12:
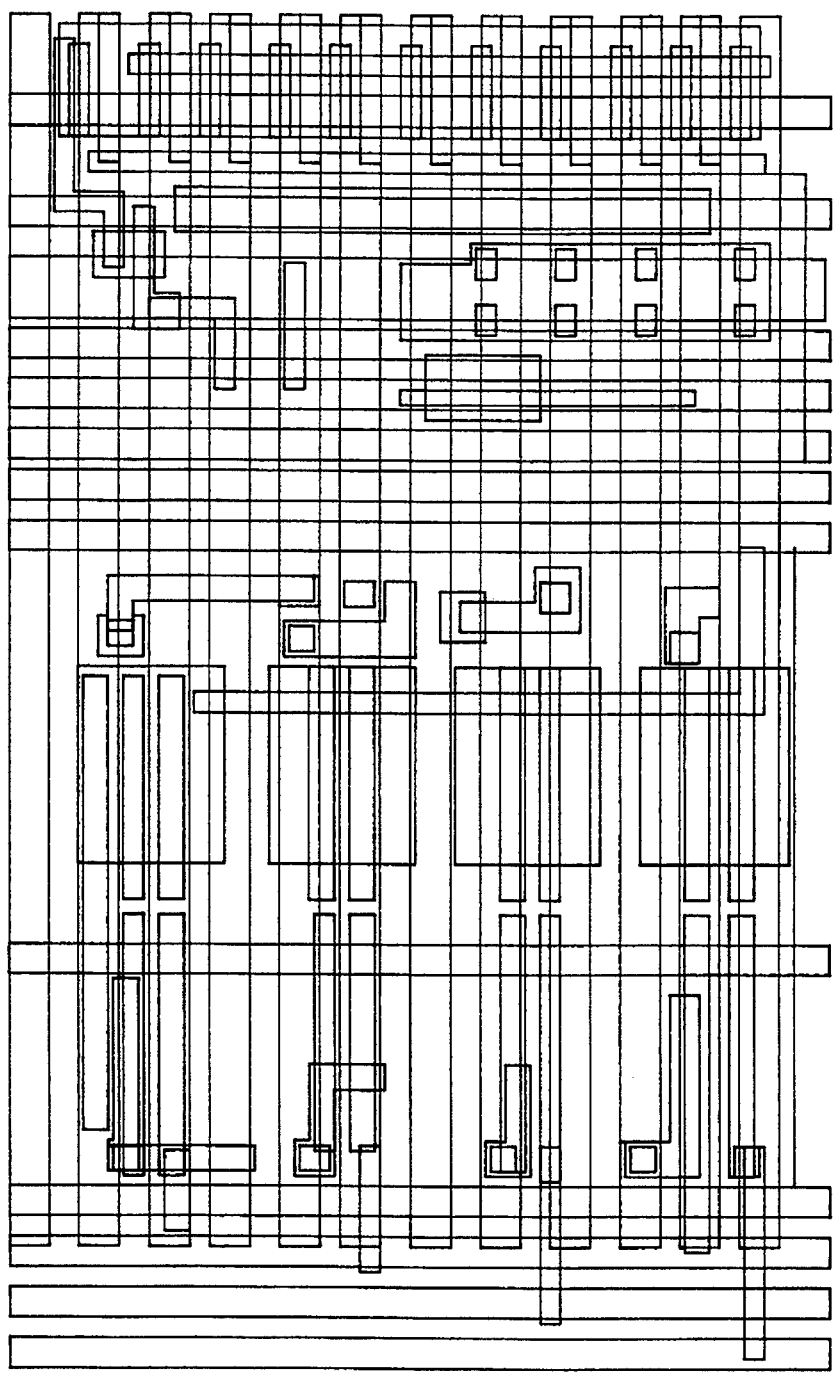
FIG. 12 is a layout of a "standard" multiplexer (one port)
Figure 13:
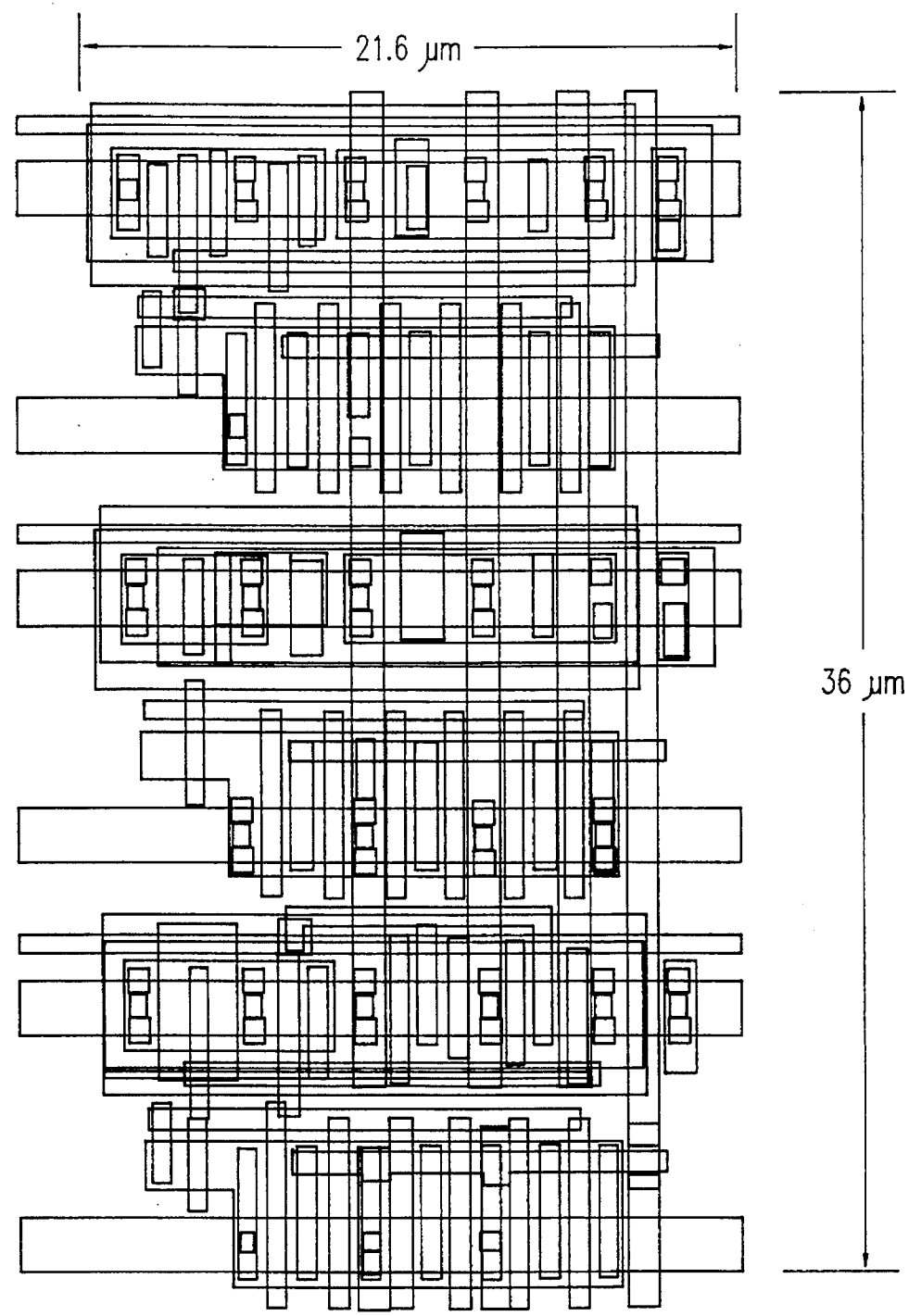
FIG. 13 is a layout of an "alternate" multiplexer (three ports)

The layout for a "standard" approach multiplexer, shown in FIG. 12, occupies an area of 21.6 μm×35.7 μm for a single port, and hence occupies 21.6 μm×107.1 μm for three read ports. In the "alternate" approach, shown in FIG. 13, the multiplexer devices external to the cell array are shown laid out in an area of 21.6 μm×36μ for all three ports.

Hence, for a block of eight rows, having three read ports and two write ports, the total block height in the "standard" approach here would be 223.1 μm, and in the "alternate" approach would be 241.6 μm. On the other hand, the standard approach would require eight read bit lines, two write bit lines, and three output read lines for a total of thirteen vertical lines, excluding power and ground, whereas the corresponding number of vertical lines in the "alternate" approach is only eight. This example shows the typical trade-offs between the two approaches.

Figure 14:
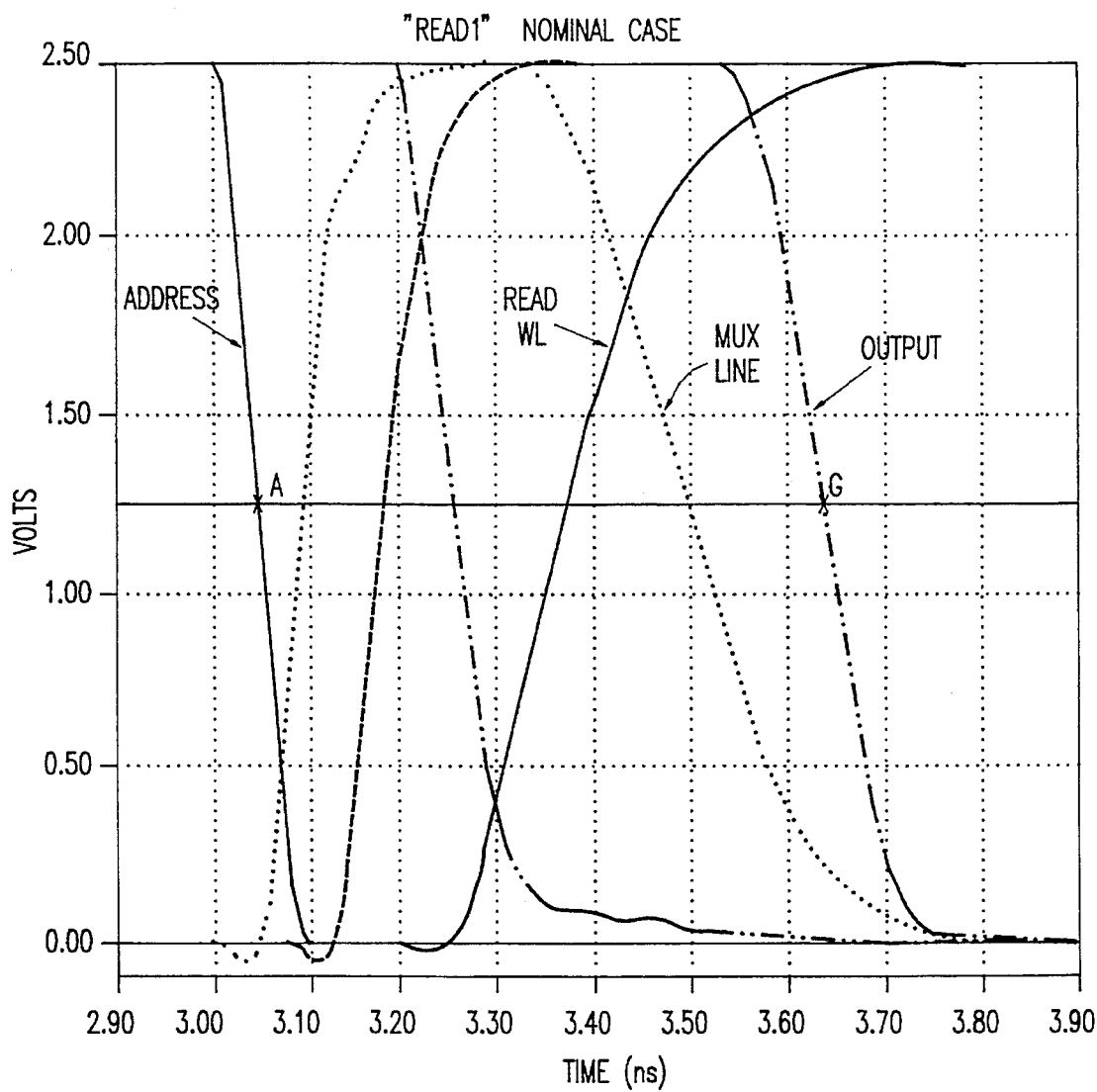
FIG. 14 is a graph showing nominal complete read access time achieved by the invention.
Figure 15:
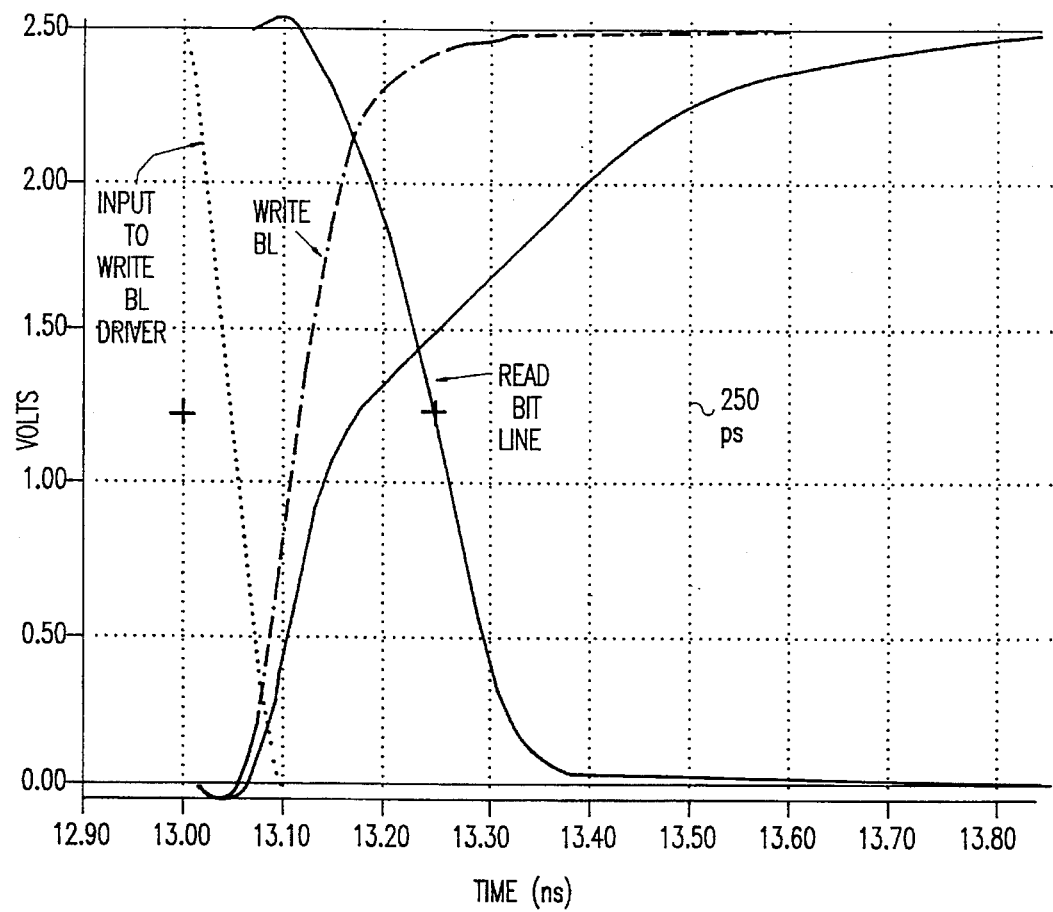
FIG. 15 is a graph showing the time from the start of the write bit line transition to the 50% point of the read bit line transition.

The nominal complete read access in this design is shown in FIG. 14, which is a graph of voltages on the address line, read line, multiplexer line, and output line as functions of time. FIG. 14 specifically shows a 583 ps nominal read access time in this case. The nominal write time is similarly very fast. FIG. 15 shows the time from the start of the input to the write bit line driver, to the 50% point of the read bit line transition, to be about 250 ps. This design is 50–100% faster than a similar design using dual-rail bit lines and sense amplifiers, but is only 25–30% larger in area, and includes the LSSD testing provisions.

From the foregoing, it will be appreciated by those skilled in the art that the invention provides a high performance, multi-port register file by partitioning the register file into blocks along the data flow (read bit line) direction. Each block contains a group of registers whose read outputs, for a given port, are multiplexed together. The outputs of all of the blocks are dot-ORed onto a single output line. A single read decoder (for each port) can be provided for the entire register file, rather than a separate decoder for each block. This ensures that the output of a single register is correctly applied to the output. Although the dataflow direction is partitioned for reading, it is not partitioned for writing. Single-ended write bit lines extend the full height of the register file (dataflow direction) and apply data simultaneously to all blocks.

While the invention has been described in terms of two preferred embodiments, denoted the "standard" approach and the "alternate" approach, those skilled in the art will recognize that the invention can be practiced with modification within the spirit and scope of the appended claims.

Having thus described our invention, what we claim as new and desire to secure by Letters Patent is as follows:

1. A multi-port register file employing single-ended reading and writing, comprising:

a plurality of read-ports and a plurality of write-ports;

an assembly of blocks, each block consisting of a sub-array of multi-port register file cells and associated multiplexing circuits;

write bit lines extending a full height of the register file with no partitioning along the write bit lines; and for a given read-port, outputs of all multiplexing circuits from all the blocks being dot-ORed together onto a single global output line for an entire, full register file.

2. The register file recited in claim 1 wherein the multiplexing circuits in each block are completely external to the sub-array of register file cells of each block.

3. The register file recited in claim 1 wherein the multiplexing circuits in each block are distributed and integrated into the sub-array of register file cells of each block.

4. The register file recited in claim 1 further comprising extra latches, pass gates, and controls included within every register file cell, for the purpose of enabling full LSSD testing of all registers of the register file.

5. A multi-port register file employing single-ended reading and writing, comprising:

a plurality of read-ports and a plurality of write-ports;

an assembly of blocks, each block consisting of a sub-array of multi-port register file cells and associated dynamic multiplexing circuits compatible with self-resetting CMOS circuits;

write bit lines extending a full height of the register file with no partitioning along the write bit lines; and for a given read-port, outputs of the multiplexing circuits from all the blocks are dot-ORed together onto a single global output line with a single read decoder for an entire, full register file.

6. The register file recited in claim 5 further comprising within every register file cell, extra latches, pass gates, and controls included for the purpose of enabling full LSSD testing of all registers of the register file.

7. A multi-port register file employing single-ended reading and writing, comprising:

a plurality of read-ports and a plurality of write-ports;

an assembly of blocks, each block consisting of a sub-array of multi-port register file cells and associated dynamic multiplexing circuits compatible with self-resetting CMOS circuits, said multiplexing circuits being completely external to the cells of the sub-array;

write bit lines extending a full height of the register file and connected to each cell of each sub-array of cells with no partitioning along the write bit lines; and for a given read-port, outputs of the multiplexing circuits from all the blocks are dot-ORed together onto a single global output line with a single read decoder for an entire, full register file.

8. A multi-port register file employing single-ended reading and writing, comprising:

a plurality of read-ports and a plurality of write-ports;

an assembly of blocks, each block consisting of a sub-array of multi-port register file cells and associated dynamic multiplexing circuits compatible with self-resetting CMOS circuits, said multiplexing circuits being distributed and integrated into the cells of the sub-array;

write bit lines extending a full height of the register file and connected to each cell of each sub-array of cells with no partitioning along the write bit lines; and for a given read-port, outputs of the multiplexing circuits from all the blocks are dot-ORed together onto a single global output line with a single read decoder for an entire, full register file.

* * * * *